US009230793B2

(12) United States Patent
Sung

(10) Patent No.: US 9,230,793 B2
(45) Date of Patent: Jan. 5, 2016

(54) SEMICONDUCTOR DEVICE AND METHOD FOR FORMING THE SAME

(71) Applicant: SK hynix Inc., Icheon-si (KR)

(72) Inventor: Min Chul Sung, Seoul (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/197,170

(22) Filed: Mar. 4, 2014

(65) Prior Publication Data

US 2015/0108574 A1 Apr. 23, 2015

(30) Foreign Application Priority Data

Oct. 17, 2013 (KR) .......................... 10-2013-0123945

(51) Int. Cl.
*H01L 27/12* (2006.01)
*H01L 27/108* (2006.01)
*H01L 29/78* (2006.01)
*H01L 21/02* (2006.01)
*H01L 21/18* (2006.01)
*H01L 21/74* (2006.01)
*H01L 21/762* (2006.01)

(52) U.S. Cl.
CPC .... *H01L 21/02038* (2013.01); *H01L 21/02002* (2013.01); *H01L 21/185* (2013.01); *H01L 21/743* (2013.01); *H01L 21/76251* (2013.01); *H01L 27/10823* (2013.01); *H01L 27/10855* (2013.01); *H01L 27/10876* (2013.01); *H01L 27/10885* (2013.01); *H01L 27/10888* (2013.01); *H01L 27/10894* (2013.01); *H01L 29/7827* (2013.01); *H01L 27/10814* (2013.01)

(58) Field of Classification Search
CPC ............ H01L 21/743; H01L 21/76251; H01L 21/76254; H01L 27/10885; H01L 27/10894; H01L 21/185; H01L 21/02002; H01L 21/02038; H01L 27/10814; H01L 21/10885; H01L 29/7827; H01L 29/78642
See application file for complete search history.

(56) References Cited

U.S. PATENT DOCUMENTS

| | | | |
|---|---|---|---|
| 2009/0146325 A1* | 6/2009 | Liu et al. | 257/797 |
| 2010/0244110 A1 | 9/2010 | Kim et al. | |
| 2011/0101445 A1* | 5/2011 | Kim et al. | 257/328 |
| 2011/0204427 A1* | 8/2011 | Choi et al. | 257/296 |
| 2013/0256830 A1* | 10/2013 | Barth et al. | 257/508 |

FOREIGN PATENT DOCUMENTS

| | | | |
|---|---|---|---|
| KR | 10-2010-0107724 A | 10/2010 | |
| KR | 10-2011-0049628 A | 5/2011 | |

* cited by examiner

Primary Examiner — Erik Kielin

(57) ABSTRACT

A semiconductor device has a semiconductor substrate including a cell region and a peripheral region and includes: a Silicon-Metal-Silicon (SMS)-structured wafer formed in the cell region, which includes a stacked structure of a first silicon substrate, a metal layer, and a second silicon substrate; and a Silicon On Insulator (SOI)-structured wafer formed in the peripheral region, which includes a stacked structure of the first silicon substrate, a silicon insulation film, and the second silicon substrate.

20 Claims, 32 Drawing Sheets

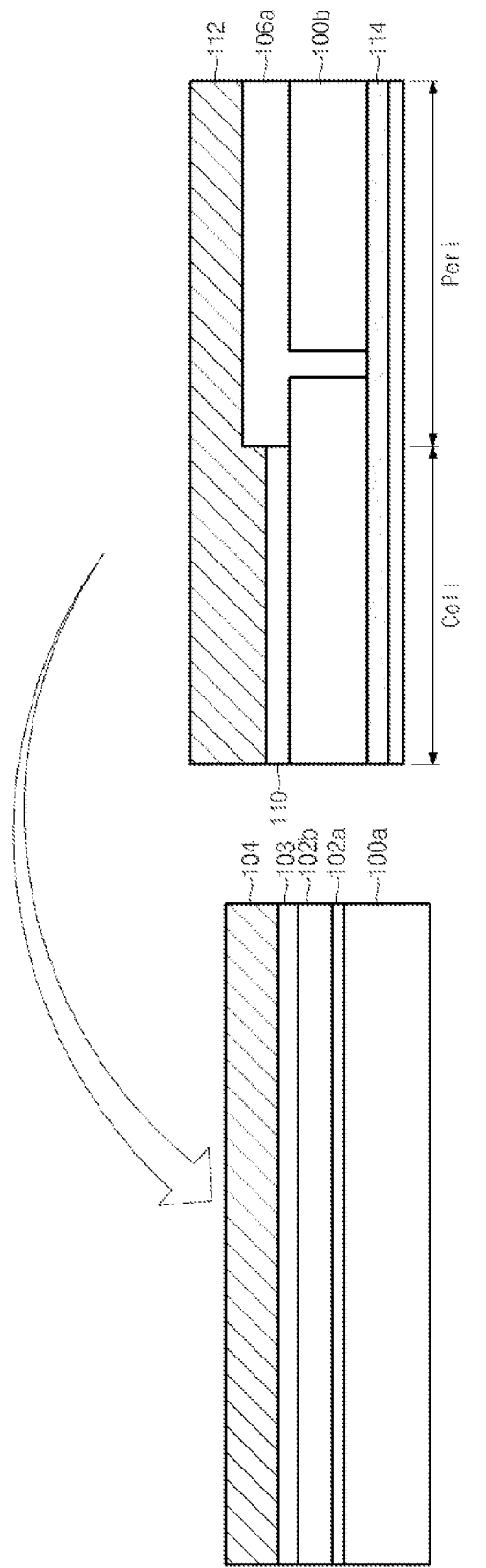

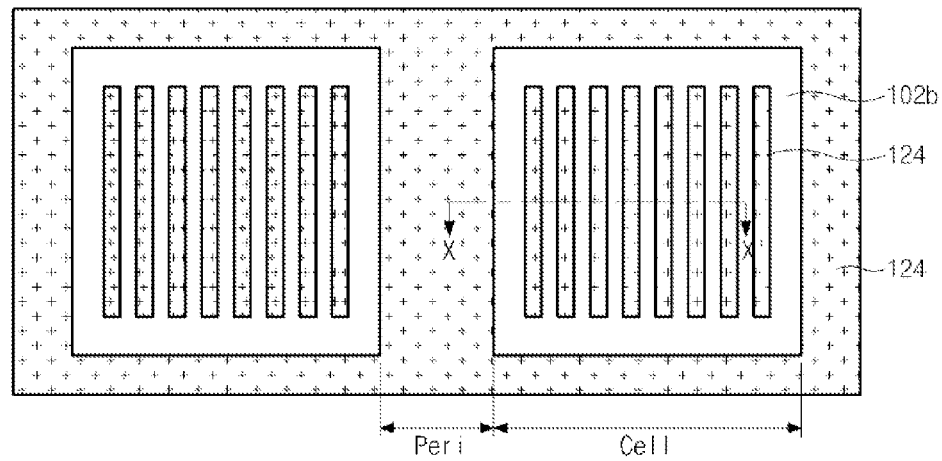
Fig.4B (i)
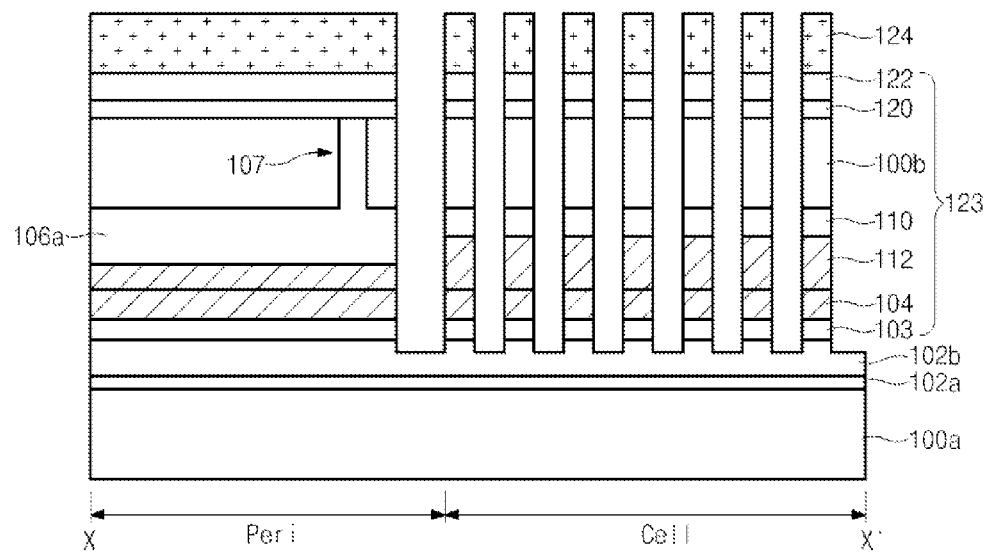
Fig.4B (ii)

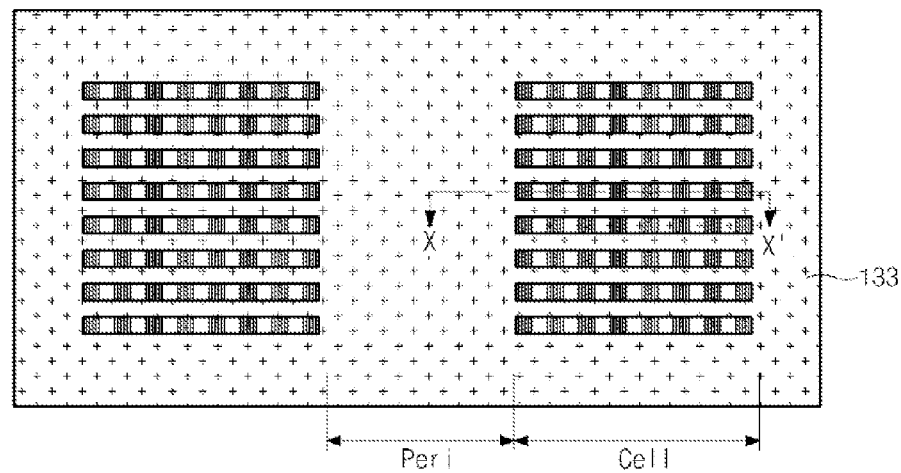
Fig.4H (i)
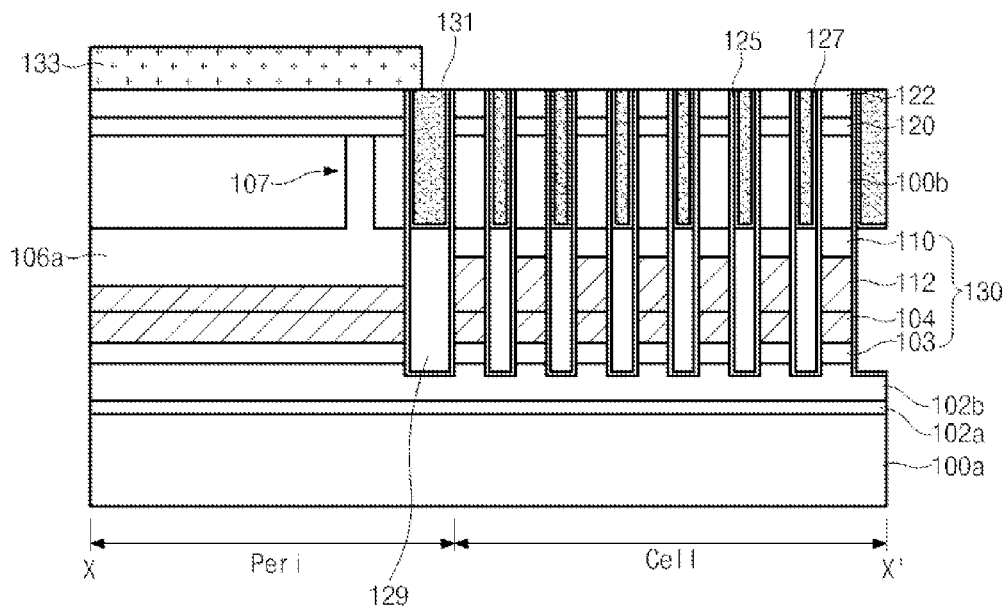
Fig.4H (ii)

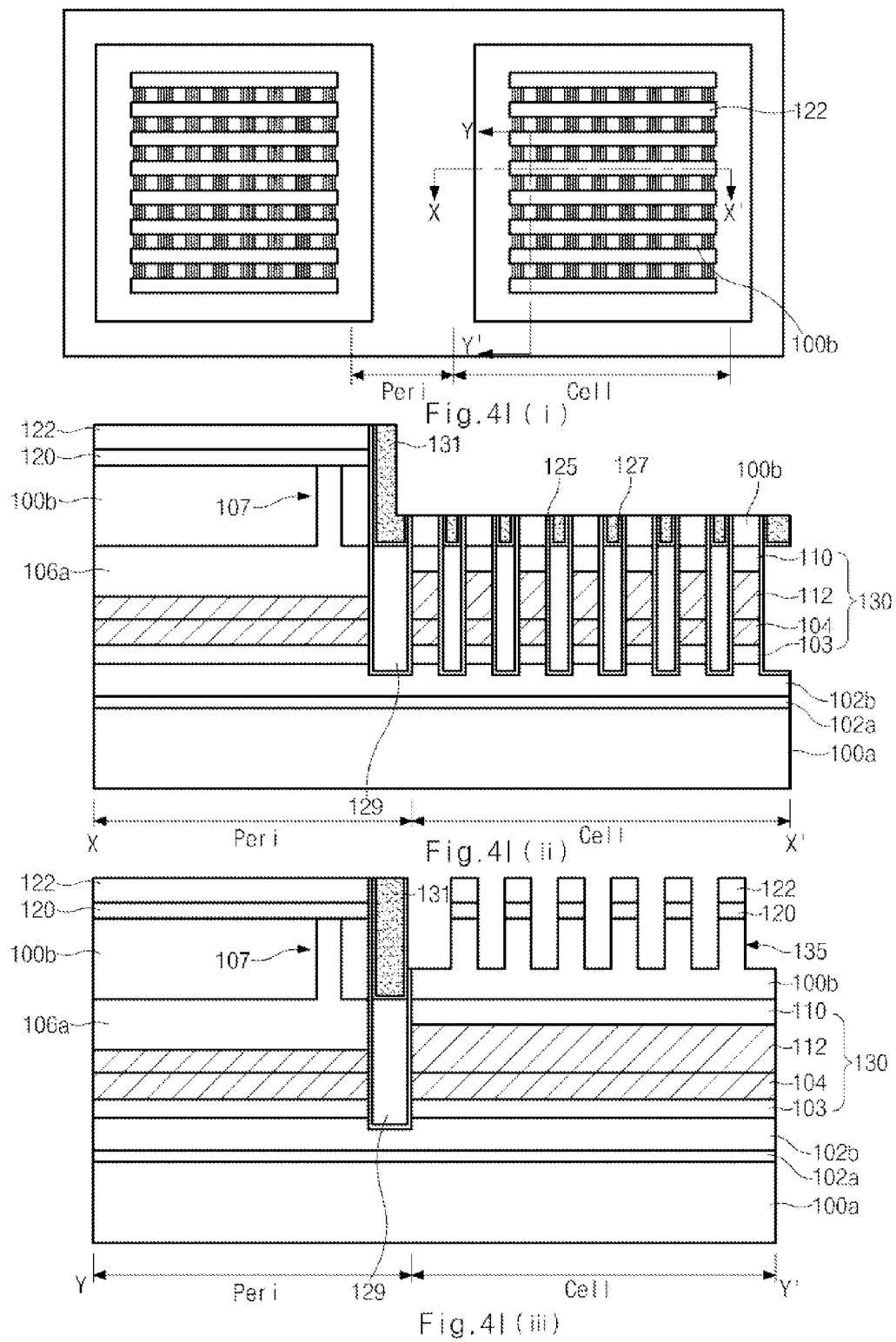

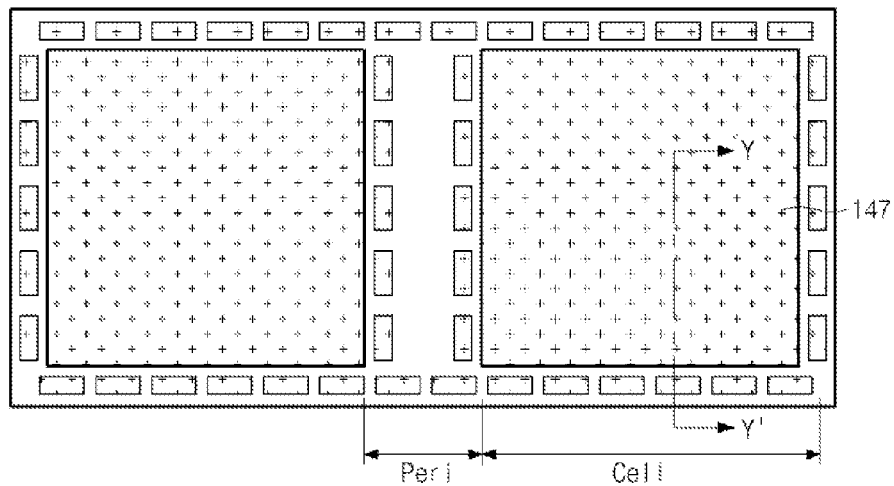
Fig.4P(i)
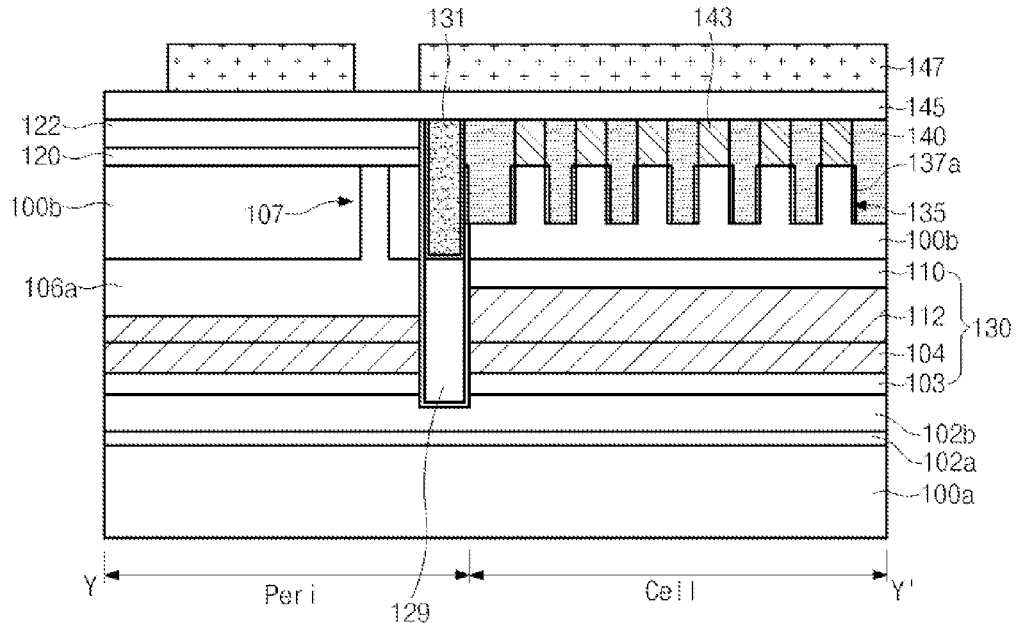
Fig.4P(ii)

SEMICONDUCTOR DEVICE AND METHOD FOR FORMING THE SAME

CROSS-REFERENCE TO RELATED APPLICATION

The priority of Korean patent application No. 10-2013-0123945 filed on 17 Oct. 2013, the disclosure of which is hereby incorporated by reference in its entirety, is claimed.

BACKGROUND

Embodiments relate to a semiconductor device and a method for forming the same, and more particularly to a semiconductor device including a vertical gate.

As the integration degree of a semiconductor device is increased, a channel length of a transistor is gradually decreased. However, the reduction in channel length of the transistor may result in a Drain Induced Barrier Lowering (DIBL) phenomenon, a hot carrier effect, and a short channel effect such as punch-through. In order to address such issues, a variety of methods are being intensively researched by many developers and companies, for example, a method for reducing a depth of a junction region, a method for relatively increasing a channel length by forming a recess in a channel region of a transistor, and the like.

However, the integration density of a semiconductor memory device (especially, Dynamic Random Access Memory (DRAM)) has come close to Gigabits, it is necessary to manufacture a smaller-sized transistor. Therefore, under a structure using a current planar transistor in which a gate electrode is formed over a semiconductor substrate and a junction region is formed at both sides of the gate electrode, it is difficult to satisfy a required unit cell size. In order to solve the above-mentioned problems, a vertical channel transistor structure is recently proposed. However, a vertical-channel transistor structure may utilize a complicated fabrication process. Specifically, the vertical-channel transistor has a difficulty in forming a buried bit line at a lower portion of a word line, such that it is hard to mass-production. In addition, as a unit cell of the semiconductor device is gradually reduced in size, there is a need to improve performance (or throughput) of a circuit formed in the peripheral region.

SUMMARY

Various embodiments are directed to providing a semiconductor device and a method for forming the same that addresses one or more problems due to limitations and disadvantages of the related art.

An embodiment relates to a semiconductor device in which a Silicon-Metal-Silicon (SMS) structure is applied to a cell region so as to reduce fabrication difficulty of a buried bit line, and a Silicon On Insulator (SOI) structure is applied to a peripheral region so as to improve performance or throughput of a circuit formed in the peripheral region, and a method for forming the same.

In accordance with an aspect of the embodiment, a semiconductor substrate including a cell region and a peripheral region, a Silicon-Metal-Silicon (SMS)-structured wafer provided in the cell region and including a stacked structure of a first silicon substrate, a metal layer, and a second silicon substrate; and a Silicon On Insulator (SOI)-structured wafer provided in the peripheral region and including a stacked structure of the first silicon substrate, a silicon insulation film, and the second silicon substrate.

In accordance with another aspect of the embodiment, a method for forming a semiconductor device, the method comprising: providing a first wafer in which a first metal layer is formed over a first silicon substrate; providing a second wafer including a second silicon substrate, and having a silicon insulation film pattern formed in a peripheral region, wherein a second metal layer is formed over the second silicon substrate including the silicon insulation film pattern; and adhering the first wafer to the second wafer so that the first metal layer faces the second metal layer.

Forming a recess by etching the second silicon substrate in the peripheral region; and forming an alignment key by filling the recess with a silicon insulation film.

The first metal layer and the second metal layer include tungsten (W).

Forming a metal silicide layer between the second metal layer and the second silicon substrate.

Forming an ion implantation layer in the second silicon substrate by applying an ion implantation process to an upper surface of the second wafer.

The ion implantation process is performed using hydrogen (H) ions.

The first wafer to the second wafer includes: adhering the second metal layer of the second wafer to the first metal layer of the first wafer in such a manner that the first metal layer of the first wafer is in contact with the second metal layer of the second wafer.

The first wafer to the second wafer further includes: performing a thermal annealing process.

After the adhering the first wafer to the second wafer, removing the ion implantation layer and the second silicon substrate formed over the ion implantation layer.

In accordance with another aspect of the embodiment, a Silicon-Metal-Silicon (SMS)-structured cell region including a stacked structure of a first silicon substrate, a metal layer, and a second silicon substrate, a Silicon On Insulator (SOI)-structured peripheral region including a stacked structure of the first silicon substrate, a silicon insulation film, and the second silicon substrate, a line-shaped buried bit line formed over the first silicon substrate of the cell region and including the metal layer; a plurality of pillar patterns formed over the buried bit line and formed by etching the second silicon substrate; and a gate formed at a sidewall of each pillar pattern so as to interconnect the plurality of pillar patterns.

In accordance with another aspect of the embodiment, a method for forming a semiconductor device includes: providing a Silicon-Metal-Silicon (SMS) structure in a cell region, wherein the SMS structure includes a stacked structure of a first silicon substrate, a metal layer, and a second silicon substrate, providing a Silicon On Insulator (SOI) structure in a peripheral region, the SOI structure including a stacked structure of the first silicon substrate, a silicon insulation film, and the second silicon substrate; forming a line pattern by etching the second silicon substrate, the metal layer, and the first silicon substrate in the cell region; forming a sacrificial film at a lower portion between the line pattern and a neighboring line pattern; forming a liner insulation film over the sacrificial film and the line patterns; and removing the sacrificial film, wherein the metal layer in the cell region serves as a buried bit line.

After the formation of the buried bit line, forming a gapfill film over the liner insulation film to fill an upper portion between the line pattern and the neighboring line pattern; forming a plurality of pillar patterns by etching the gapfill film, the liner insulation film, and the second silicon substrate of the line pattern; and forming a gate coupled to the plurality of pillar patterns at sidewalls of the pillar patterns.

The forming the plurality of pillar patterns by etching the gapfill film, the liner insulation film, and the second silicon substrate of the line pattern, further includes: forming a line-shaped mask pattern arranged in a direction perpendicular to the buried bit line; etching the gapfill film, the liner insulation film, and the second silicon substrate of the line pattern using the mask pattern as an etch mask.

The gate is arranged perpendicular to the buried bit line, formed in a line shape, and provided over sidewalls of the plurality of pillar patterns.

After the formation of the gate, forming a storage node contact (SNC) over each of the plurality of pillar patterns, and forming a storage node coupled to the storage node contact (SNC).

After the formation of the gate coupled to sidewalls of the plurality of pillar patterns, forming a trench by etching the second silicon substrate in the peripheral region; forming a device isolation film by filling the trench with an oxide film; and forming a peri-gate structure in a peripheral region of the second silicon substrate.

It is to be understood that both the foregoing general description and the following detailed description of embodiments are exemplary and explanatory and are not intended to restrictive.

BRIEF DESCRIPTION OF THE DRAWINGS

FIGS. 2A to 2J are cross-sectional views illustrating a method for forming a wafer of the semiconductor device according to an embodiment.

DESCRIPTION OF EMBODIMENTS

Reference will now be made in detail to embodiments which are illustrated in the accompanying drawings. Wherever possible, the same reference numbers are used throughout the drawings to refer to the same or like portions. A semiconductor device and a method for manufacturing the same according to embodiments will hereinafter be described with reference to the accompanying drawings.

Figure 1:
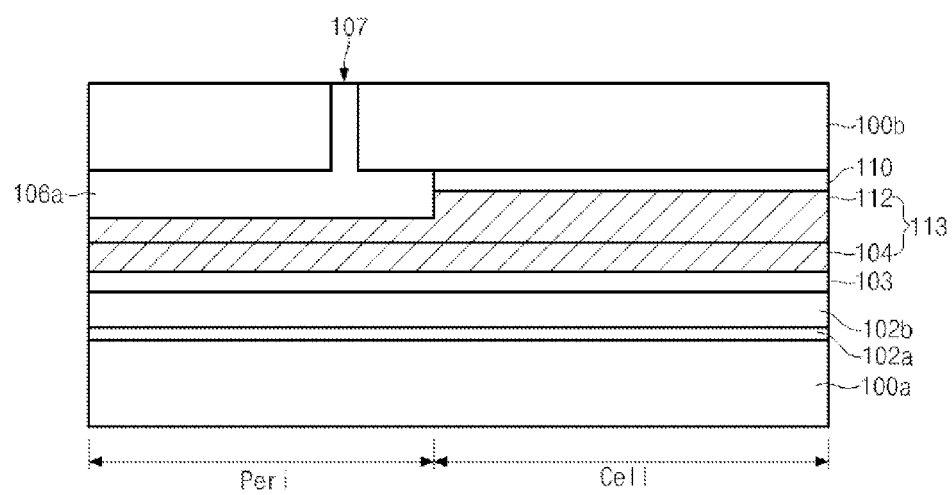
FIG. 1 is a cross-sectional view illustrating a wafer of a semiconductor device according to an embodiment.

FIG. 1 is a cross-sectional view illustrating a wafer of a semiconductor device according to an embodiment. FIG. 1 is a cross-sectional view illustrating a wafer including a double structure comprised of a Silicon-Metal-Silicon (SMS) structure to be contained in a cell region and a Silicon On Insulator (SOI) structure to be contained in a peripheral (Peri) region.

The Silicon-Metal-Silicon (SMS) region of the cell region includes a stacked structure of a first silicon insulation film 102a formed over a first silicon substrate 100a, a second silicon insulation film 102b, a titanium nitride (TiN) film 103, a metal layer 113, and a metal silicide layer 110. A second silicon substrate 100b is formed over the stacked structure. That is, the SMS structure comprised of the first silicon substrate 100a, the metal layer 113, and the second silicon substrate 100b is completely formed.

The Silicon On Insulator (SOI) structure of the peripheral region includes a stacked structure of a first silicon insulation film 102a formed over a first silicon substrate 100a, a second silicon insulation film 102b, a titanium nitride (TiN) film 103, a first metal layer 104, and a silicon insulation film pattern 106a. A second silicon substrate 100b is formed over the stacked structure, and an alignment key 107 formed of an insulation film is buried in the second silicon substrate 100b. That is, the SOI structure comprised of the first silicon substrate 100a, the silicon insulation film pattern 106a, and the second silicon substrate 100b is completely formed.

FIGS. 2A to 2J are cross-sectional views illustrating a method for forming a double-structured wafer of the semiconductor device according to an embodiment.

Figure 2A:
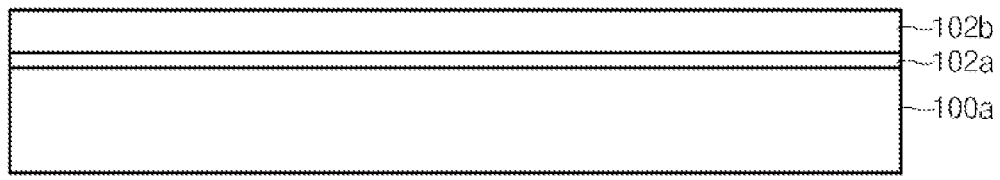

Referring to FIG. 2A, an oxidation process is applied to a surface of the first silicon substrate 100a which is used as a lower silicon region, resulting in formation of a first silicon insulation film 102a. The first silicon insulation film 102a may be formed to have a thickness of about 20~50 Å. In addition, a second silicon insulation film 102b serving as a buffer layer is formed over the first silicon insulation film 102a.

Figure 2B:
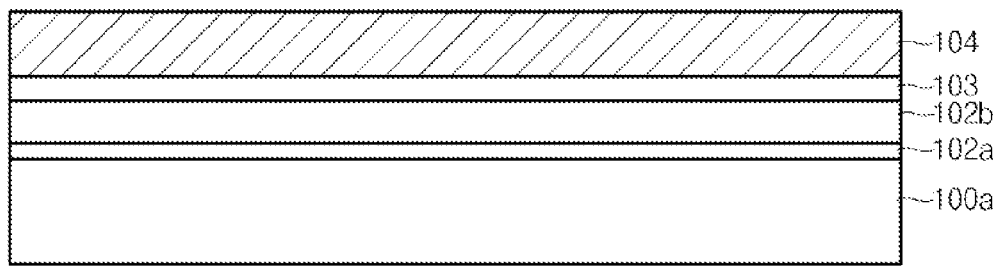

Referring to FIG. 2B, a glue layer 103 is formed over the second silicon insulation film 102b. In this case, the glue layer 103 may be formed of a titanium nitride (TiN) film. Thereafter, a first metal layer 104 is formed over the glue layer 103. The first metal layer 104 may be formed of a material including tungsten (W). This tungsten (W) material may be used as a buried bit line in a subsequent process.

Figure 2C:
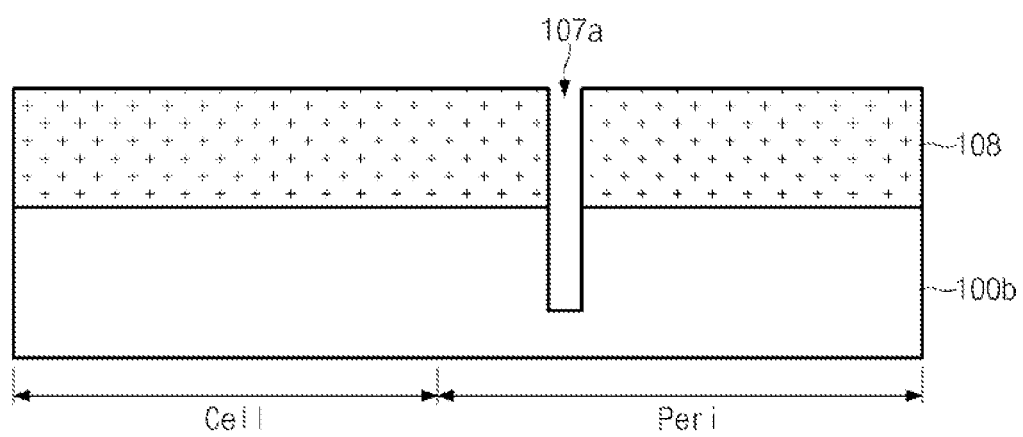

Referring to FIG. 2C, after preparation of a second silicon substrate 100b to be used as an upper silicon region, a first photoresist pattern 108 configured to open an alignment key region is formed over the second silicon substrate 100b. In this case, the alignment key region may be located at a scribe lane of the substrate. The second silicon substrate 100b is etched using the first photoresist pattern 108 as an etch mask, resulting in formation of a recess 107a. Thereafter, the first photoresist pattern 108 is removed.

Figure 2D:
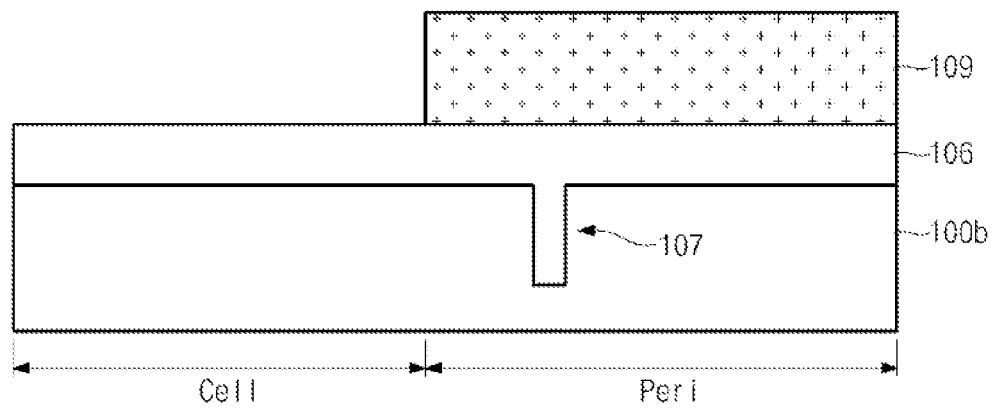

Referring to FIG. 2D, a third silicon insulation film 106 is formed over the second silicon substrate 100b including the recess 107a. In this case, a third silicon insulation film 106 is also buried in the recess 107a, resulting in formation of an alignment key 107. The third silicon insulation film 106 may be an oxide film formed by an oxidation process. Thereafter, a second photoresist pattern 109 configured to open the cell region is formed over the third silicon insulation film 106. That is, the second pattern 109 is formed over the third silicon insulation film 106 of the peripheral region.

Figure 2E:
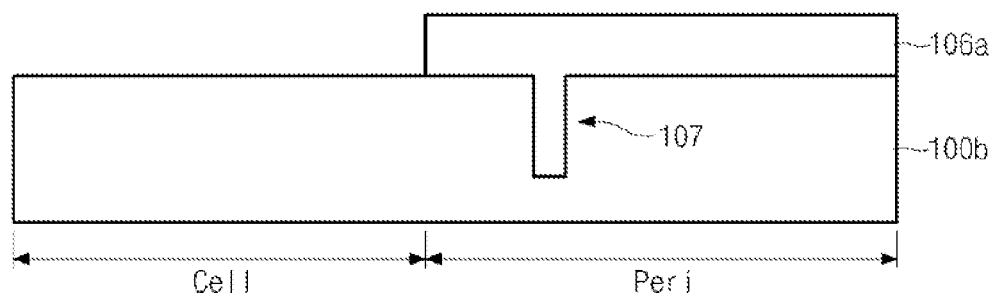

Referring to FIG. 2E, the third silicon insulation film 106 exposed in the cell region is etched using the second photoresist pattern 109 as an etch mask, resulting in formation of a silicon insulation film pattern 106a. The exposed third silicon insulation film 106 may be etched by a dry or wet etching method. Thereafter, the second photoresist pattern 109 is removed, so that the second silicon substrate 100b of the cell region is exposed.

Figure 2F:
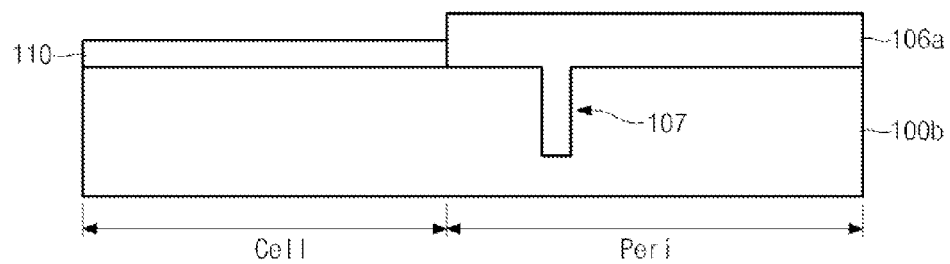

Referring to FIG. 2F, a metal layer (not shown) is formed over the exposed second silicon substrate 100b, and the metal layer (not shown) is converted into a metal silicide layer 110 by a thermal annealing process. In this case, the metal layer (not shown) may be formed of a material including cobalt (Co), and the metal silicide layer 110 may be a cobalt (Co) silicide layer which is obtained after completion of the thermal annealing process. The metal silicide layer 110 may serve as a barrier metal when a buried bit line is formed in a subsequent process, and may be formed to reduce resistance between a silicon substrate and a buried bit line.

Figure 2G:
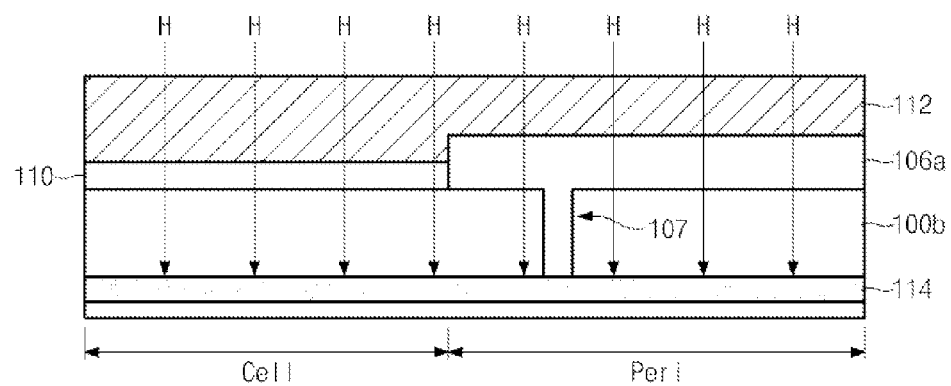
Figure 21:
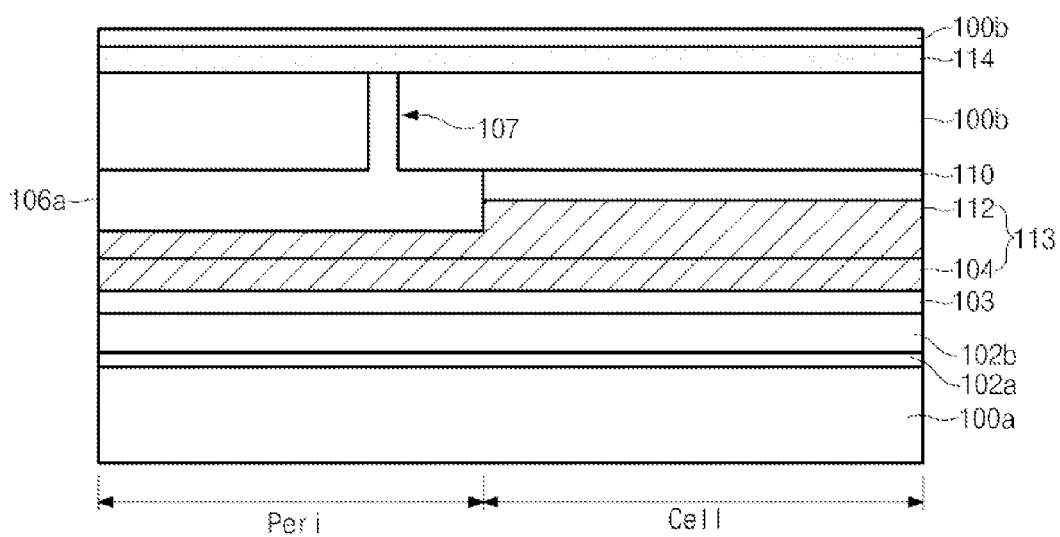
Figure 2J:
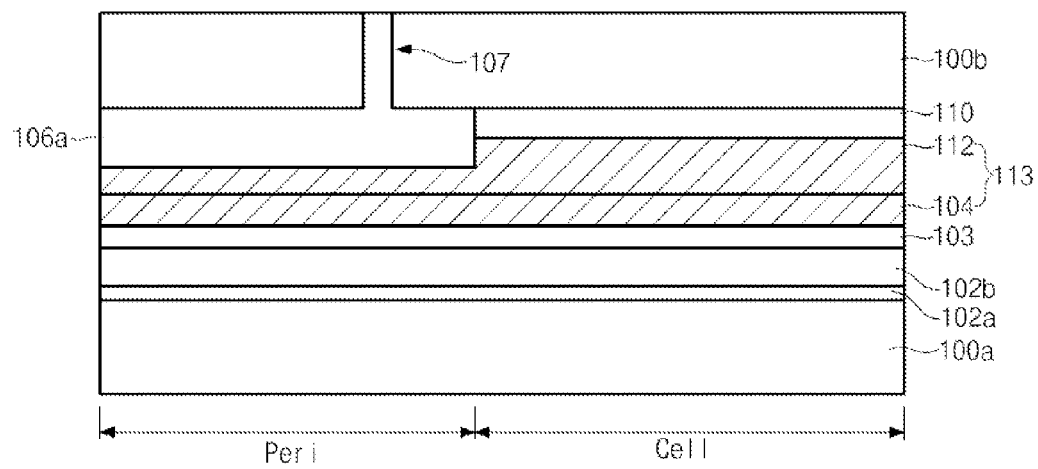

Referring to FIG. 2G, a planarized second metal layer 112 is formed over the entire surface of the second silicon substrate 100b over which the metal silicide layer 110 and the second insulation film pattern 106a are formed. A method for forming the second metal layer 112 is as follows. After a metal layer including tungsten (W) is formed over the second silicon substrate 100b over which the metal silicide layer 110 is formed, a planarization process (e.g., CMP process) is performed until the silicon insulation film pattern 106a of the peripheral region is exposed. Thereafter, a metal layer of the cell region is formed, and a metal layer including tungsten (W) is formed over the silicon insulation film pattern 106a of the peripheral region, such that a planarized second metal layer 112 is formed.

Subsequently, hydrogen (H) ions are implanted into the second silicon substrate 100b in which the second metal layer 112 is formed, such that an ion implantation layer 114 is formed at a predetermined depth of the second silicon substrate 100b. Here, the ion implantation layer 114 may be formed to easily isolate a lower portion of the second silicon substrate 100b in a subsequent process.

Referring to FIG. 2H, a process for attaching the first silicon substrate 100a to the second silicon substrate 100b is carried out. In the process for attaching the first silicon substrate 100a to the second silicon substrate 100b, the first metal layer 104 formed over the first silicon substrate 100a is brought into contact with the second metal layer 112 formed over the second silicon substrate 100b. That is, the second silicon substrate 100b is turned over so that the turned-over second silicon substrate 100b is located over the first silicon substrate 100a. Thereafter, the first metal layer 104 completely adheres to the second metal layer 112 by a thermal annealing process.

Referring to FIG. 2I, the ion implantation layer 114 is isolated from the second silicon substrate 100b formed over the ion implantation layer 114, such that a final wafer including the SMS structure and the SOI structure is completed. The process for isolating the ion implantation layer 114 from the second silicon substrate 100b may be performed by applying physical impact to the wafer. The ion implantation layer 114 is destroyed upon application of impact to the wafer, and therefore the second silicon substrate 100b and the ion implantation layer 114 are detached from each other. In this case, the isolated second silicon substrate 100b may be reused as necessary.

Through the above-mentioned fabrication processes, a double-layered wafer is formed, which includes not only a cell region formed of an SMS wafer including a Silicon-Metal-Silicon (SMS) stacked structure, but also a peripheral region formed of a Silicon On Insulator (SOI) wafer including a stacked structure of a silicon film and an insulation film.

Figure 3:
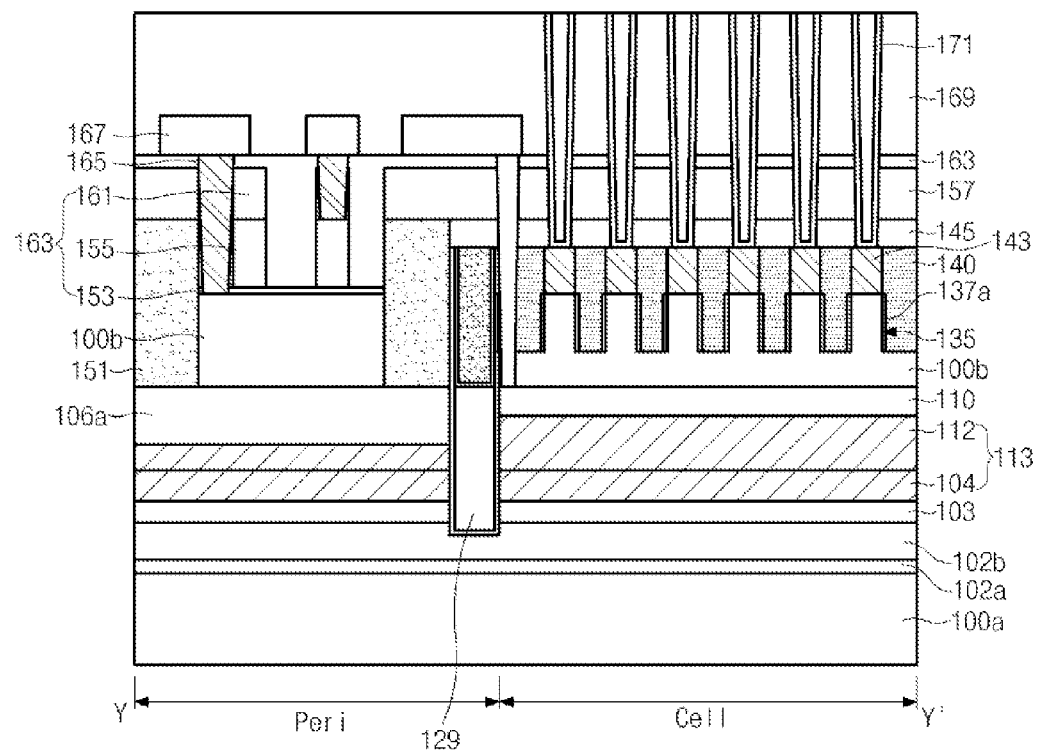
FIG. 3 is a cross-sectional view illustrating the semiconductor device according to an embodiment.

FIG. 3 is a cross-sectional view illustrating the semiconductor device according to an embodiment. Specifically, FIG. 3 illustrates the semiconductor device formed using the wafer of FIG. 1.

A wafer in which the cell region is different in structure from the peripheral region is shown in FIG. 3. The wafer includes an SMS-structured cell region. In the SMS-structured cell region, a stacked structure of a first silicon insulation film 102a, a second silicon insulation film 102b, a titanium nitride (TiN) film 103, a metal layer 113, and a metal silicide layer 110 is formed over a first silicon substrate 100a, and a second silicon substrate 100b is formed over the stacked structure. In addition, the wafer includes an SOI-structured peripheral region. In the SOI-structured peripheral region, a stacked structure of the first silicon insulation film 102a, the second silicon insulation film 102b, the first metal layer 104, and a silicon insulation film pattern 106a is formed over the first silicon substrate 100a, and the second silicon substrate 100b is formed over the stacked structure.

First, the above-mentioned cell region will hereinafter be described in detail. A buried bit line in a line shape is formed over the first silicon substrate 100a. Here, the aforementioned line-shaped buried bit line may include the titanium nitride (TiN) film 103, the first metal layer 104, the second metal layer 112, and the metal silicide layer 110. The buried bit line may use a specific portion included in the SMS-structured wafer, e.g., metal layer(s) from among SMS-structured wafer. The titanium nitride (TiN) film 103 may serve as a glue layer at a lower portion of the buried bit line 130, and the metal silicide layer 110 may serve as a barrier metal layer at an upper portion of the buried bit line 130, resulting in reduction of interfacial resistance among the first silicon substrate 100a, the second silicon substrate 100b, and the buried bit line 130.

A pillar pattern 135 formed by etching of the second silicon substrate 100b is formed over the buried bit line, a gate insulation film is formed over the pillar pattern 135, and a gate 137a is formed at a sidewall of the pillar pattern 135. A storage node contact (SNC) plug 143 is coupled to an upper portion of the pillar pattern 135, and a storage node 171 coupled to the SNC plug 143 is formed over the SNC plug 143.

Second, the peripheral (Peri) region will hereinafter be described in detail. A stacked structure of the first silicon insulation film 102a, the second silicon insulation film 102b, the titanium nitride (TiN) film 103, the first metal layer 104, the silicon insulation film pattern 106a, and the second silicon substrate 100b is formed over the first silicon substrate 100a. A device isolation film 151 and an active region defined by the device isolation film 151 are contained in the second silicon substrate 100b. A gate pattern 163 including a gate oxide film 153, a gate conductive layer 155, and a hard mask pattern 161 is formed over the active region of the second silicon substrate 100b. In addition, a contact plug 165 is formed in a first interlayer insulation film 163, and a metal line 167 coupled to the contact plug 165 is formed over the first interlayer insulation film 163. As described above, the SMS-structured wafer is employed in the cell region, such that a metal layer of the wafer may be used as a buried bit line without the necessity of forming an additional buried bit line. In addition, the SOI-structured wafer is employed in the peripheral region, such that a semiconductor device including the SOI-structured wafer may have a higher speed caused by smaller junction capacitance, lower voltage caused by a lower threshold voltage, and improved latch-up characteristics caused by reliable device-isolation, as compared to other semiconductor devices formed over a bulk-silicon substrate.

Figure 4A:
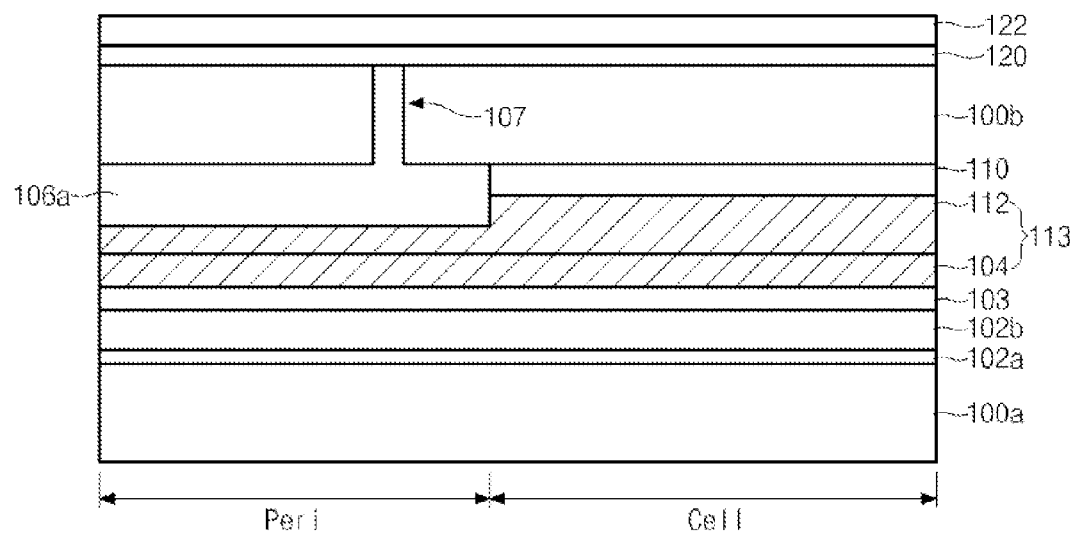
FIGS. 4A to 4W are plan views or cross-sectional views illustrating a method for forming the semiconductor device according to an embodiment.
Figure 4C:
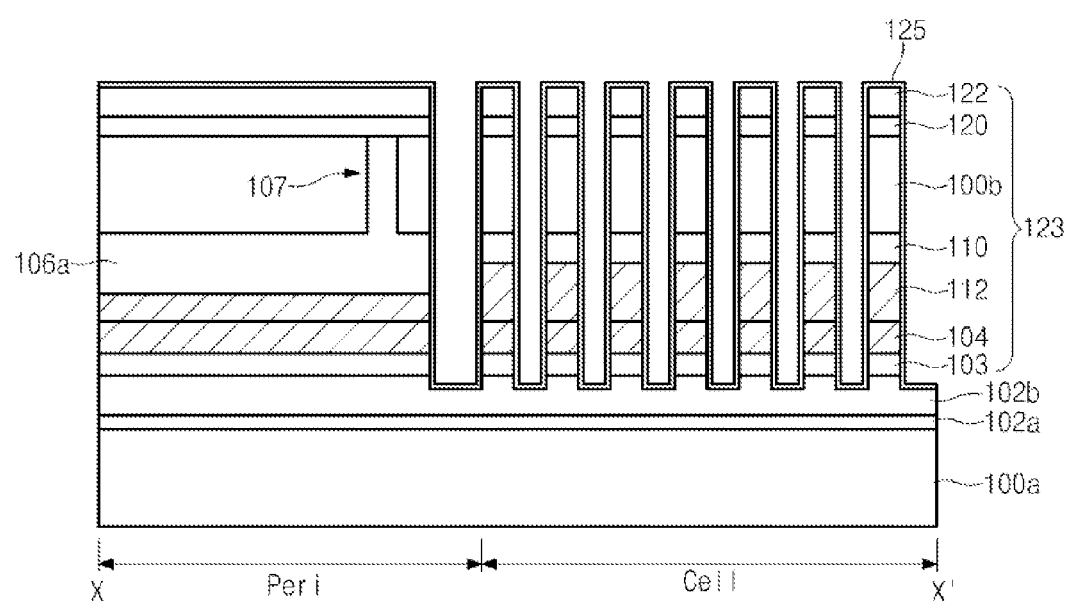
Figure 4D:
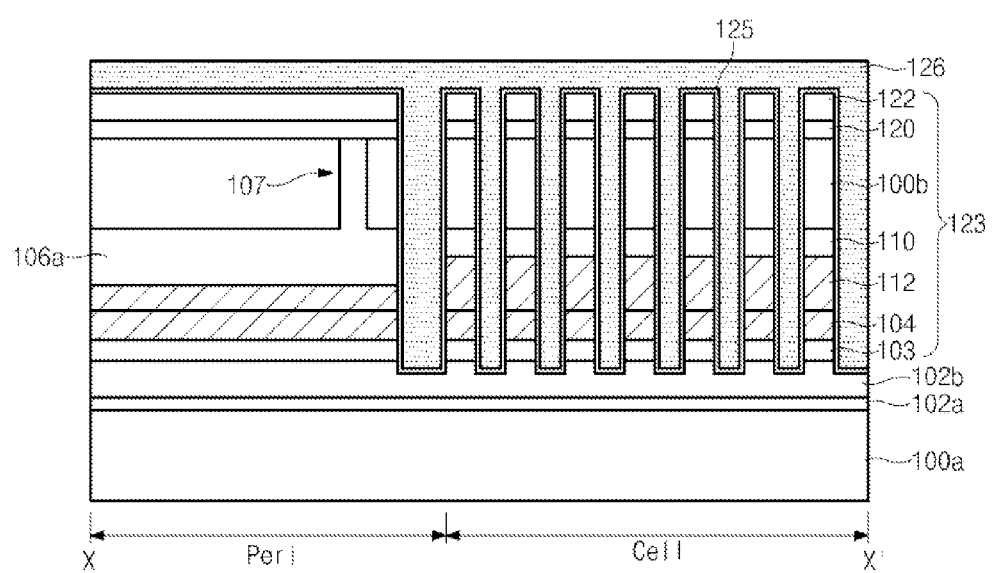
Figure 4E:
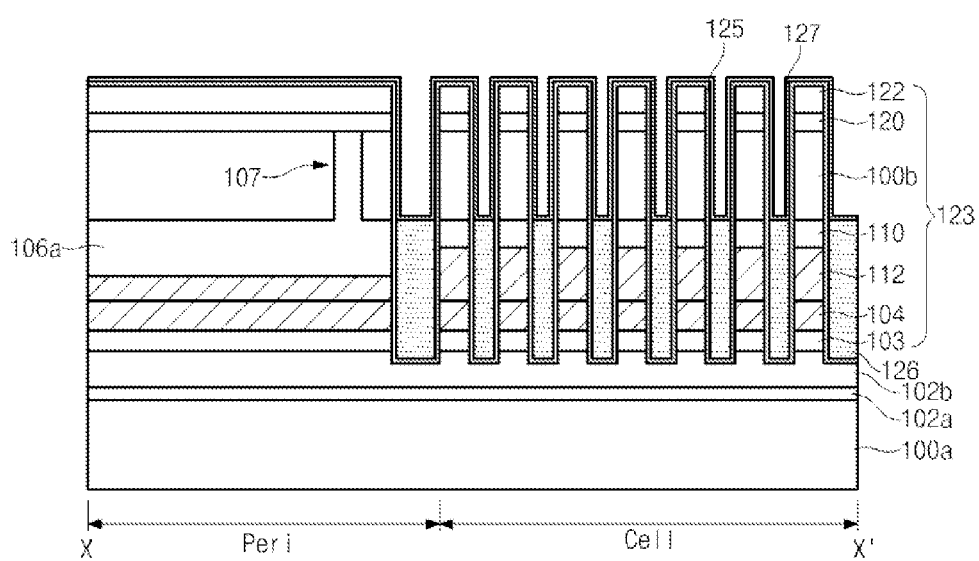
Figure 4F:
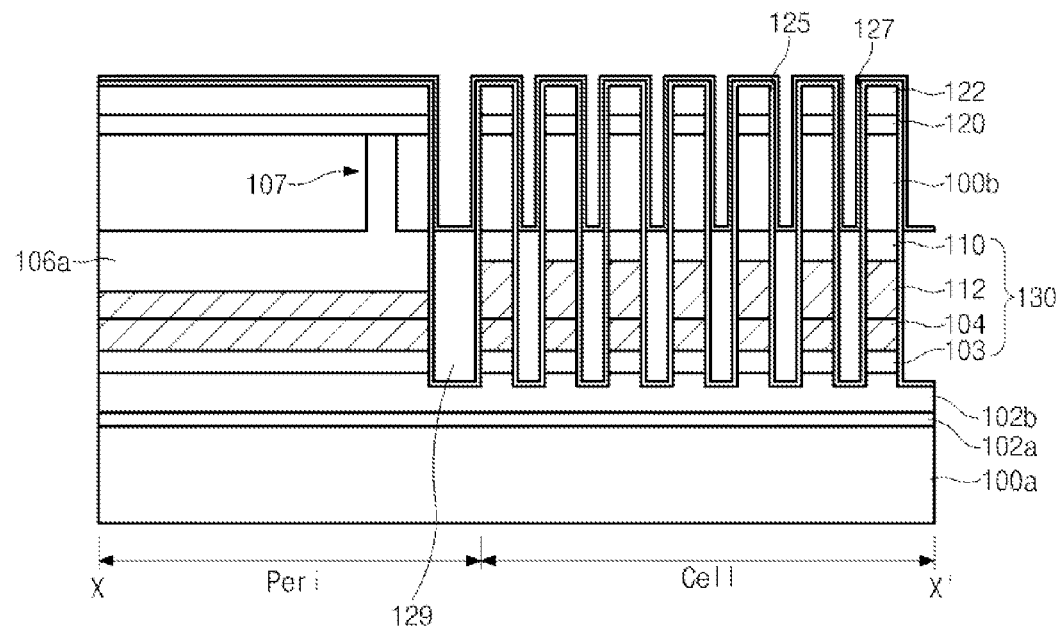
Figure 4G:
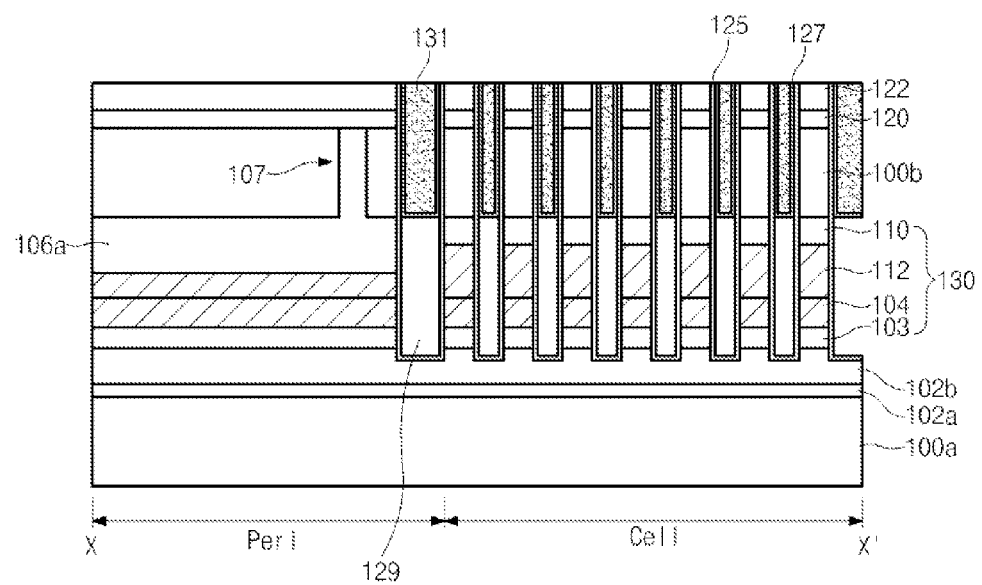
Figure 4J:
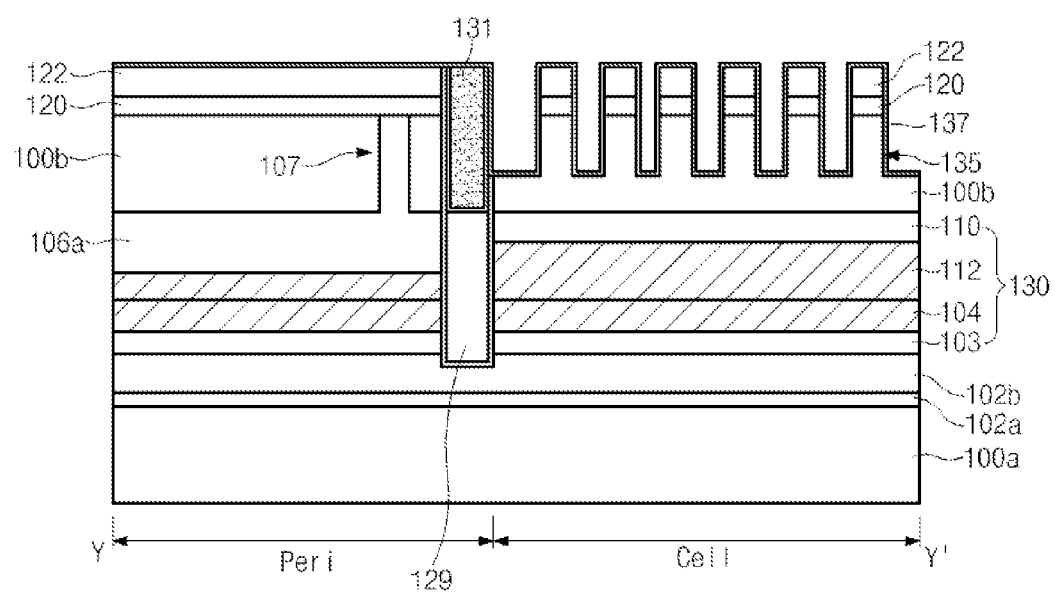
Figure 4K:
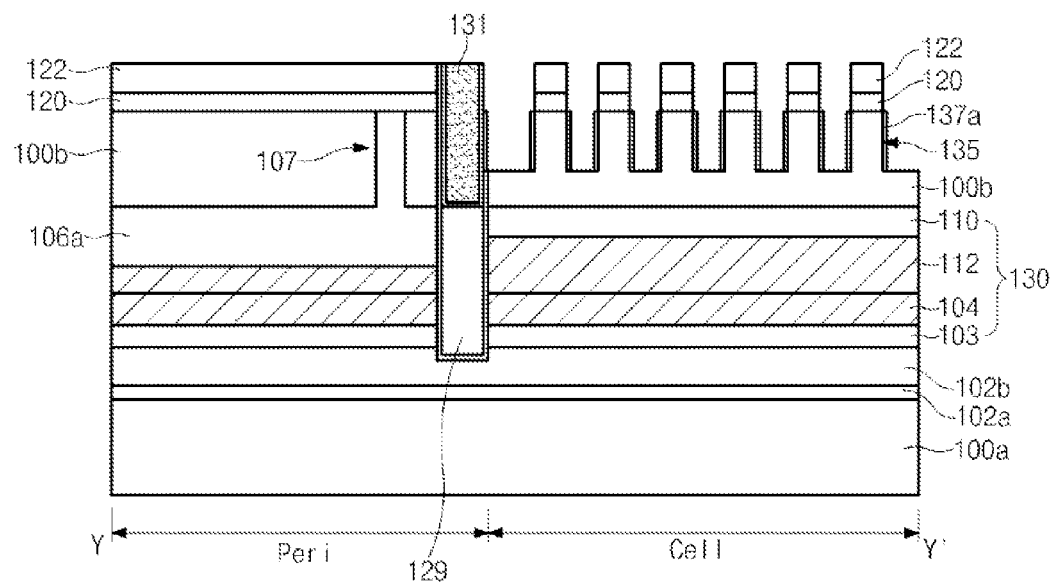
Figure 4L:
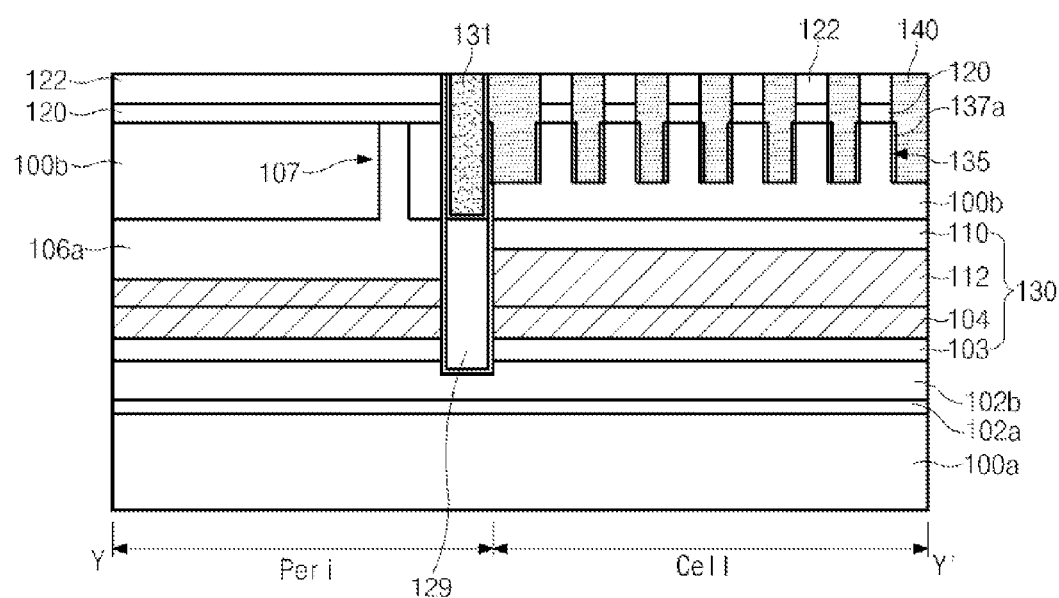
Figure 4M:
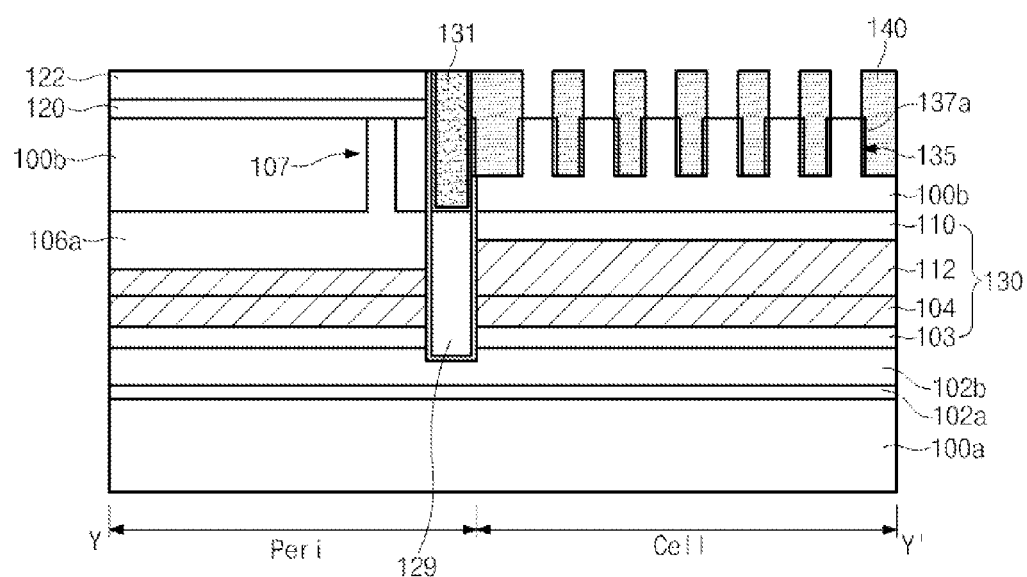
Figure 4N:
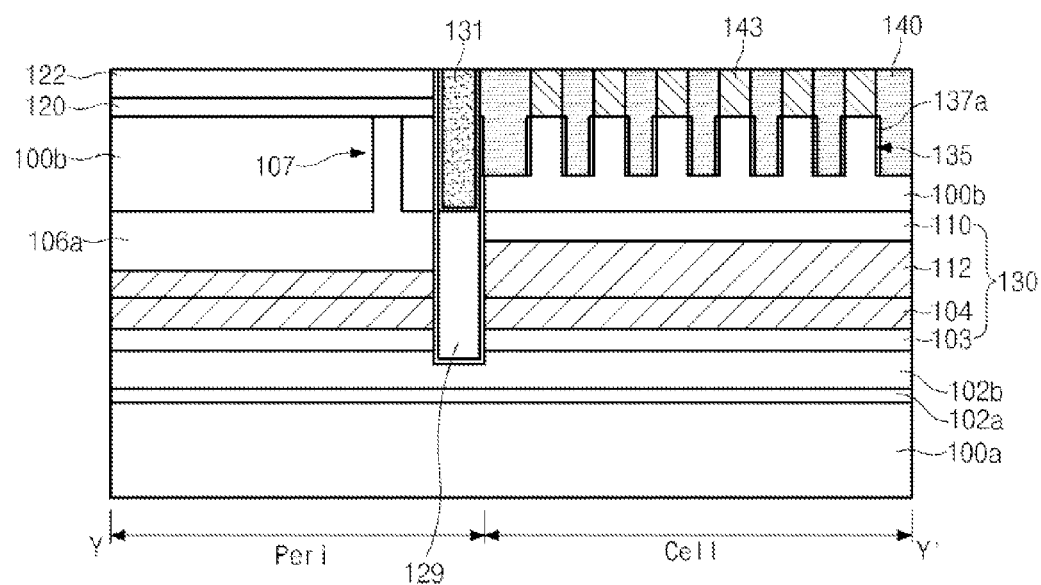
Figure 40:
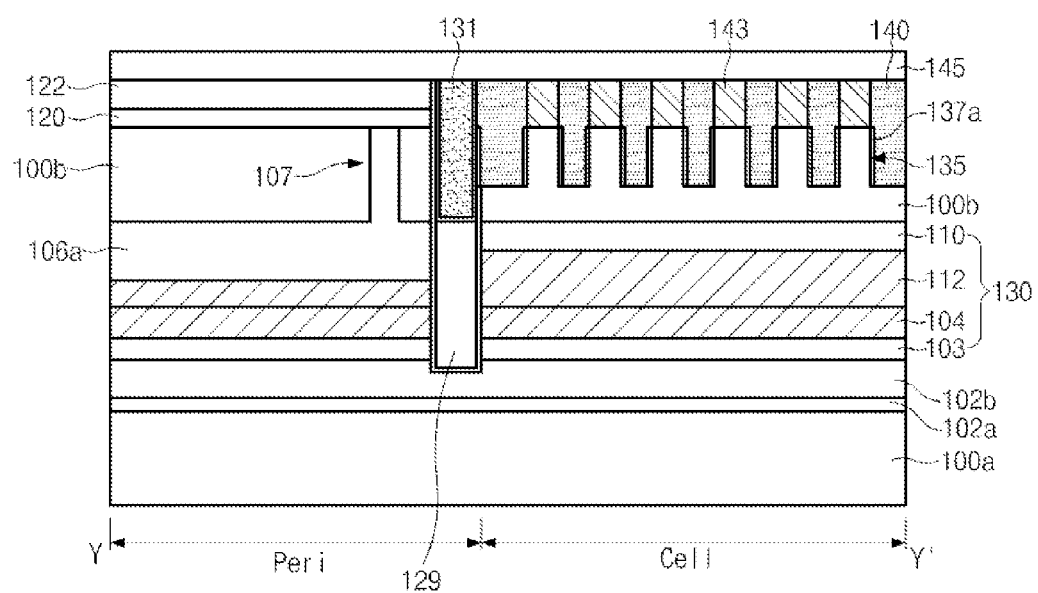
Figure 4Q:
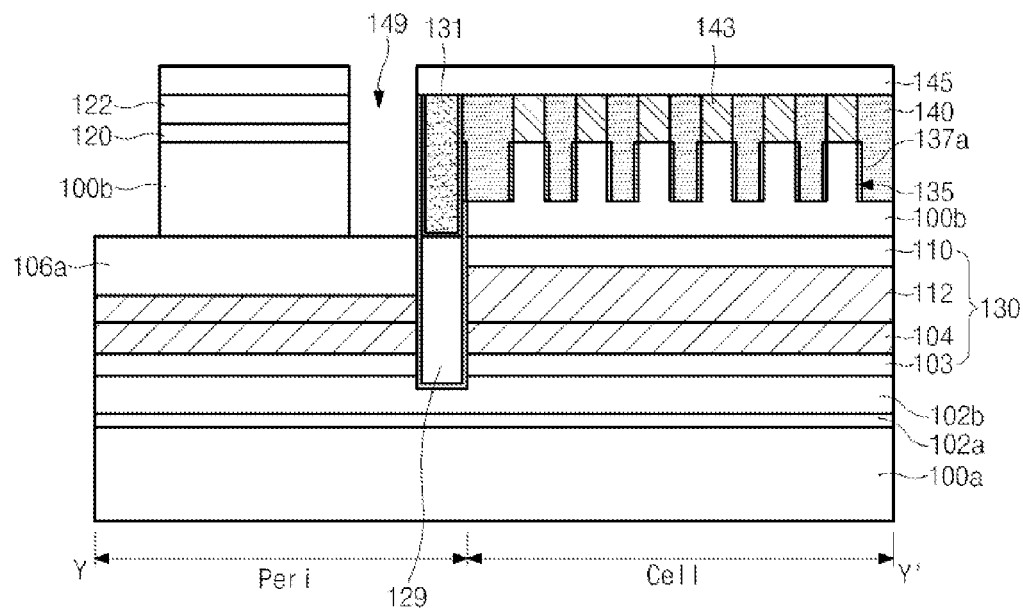
Figure 4R:
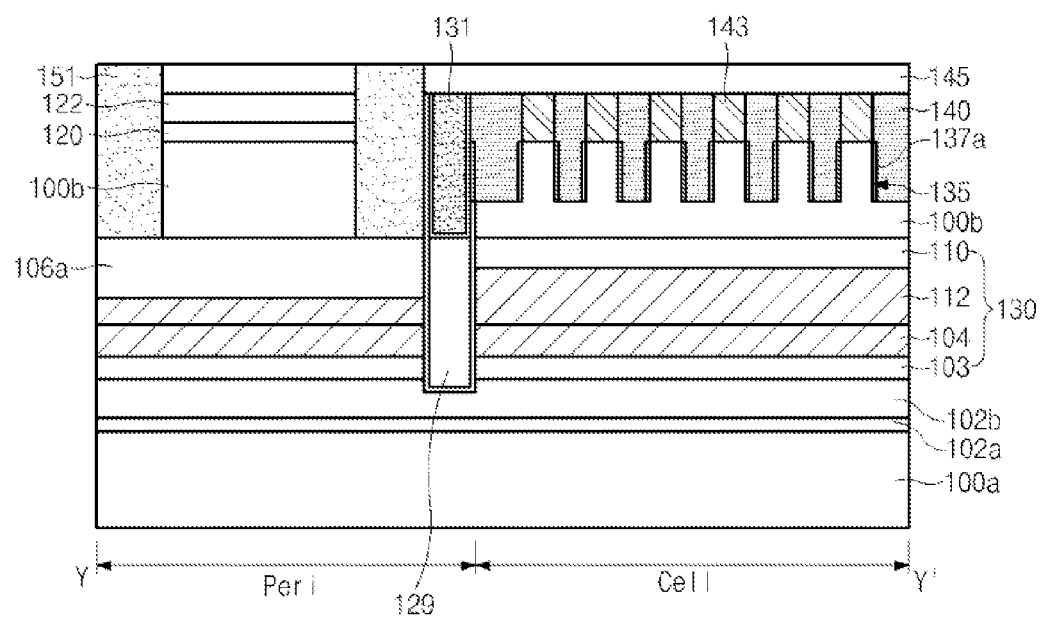
Figure 4S:
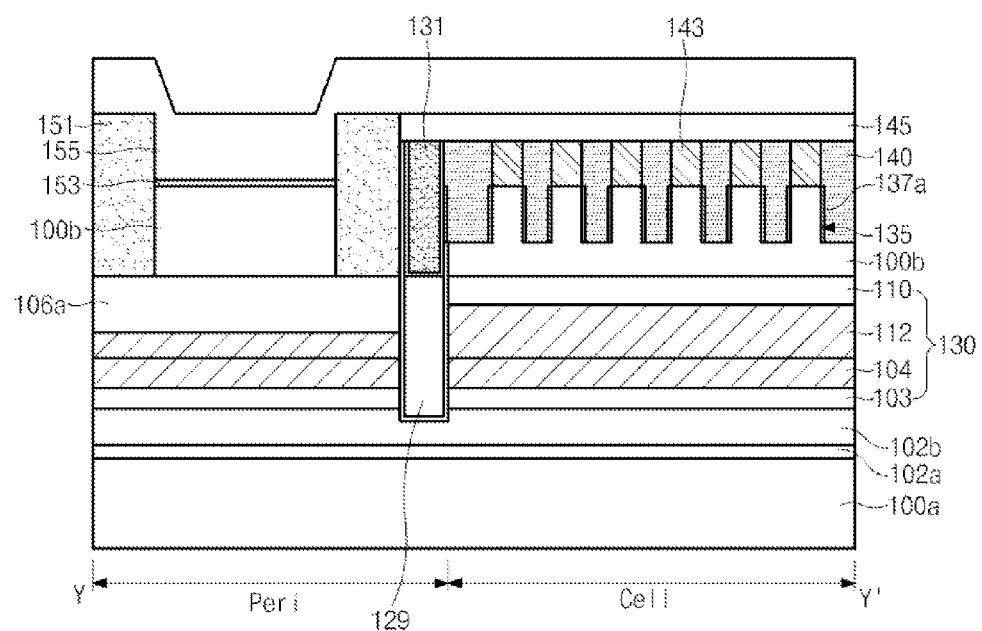
Figure 4T:
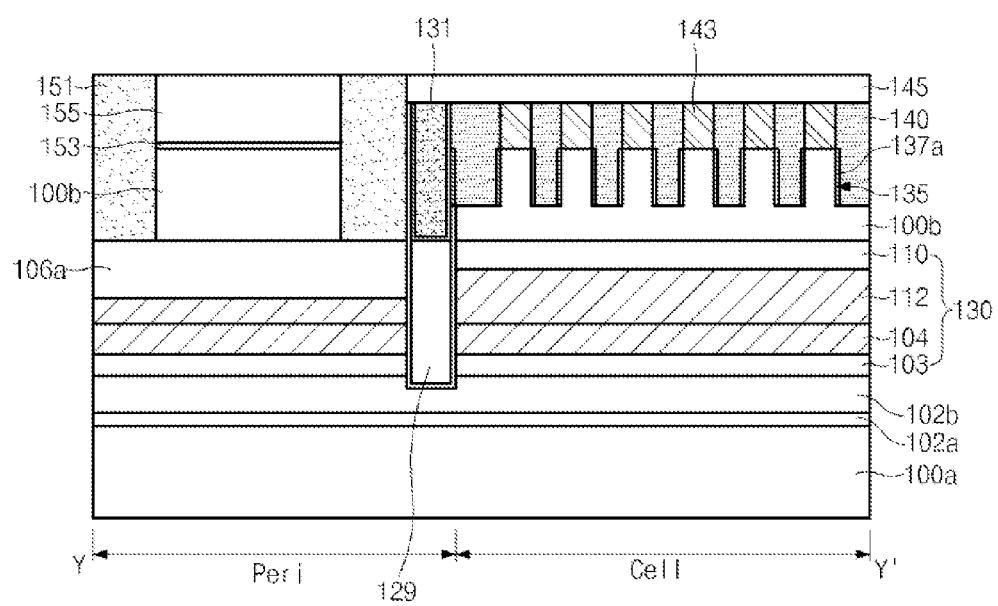
Figure 4U:
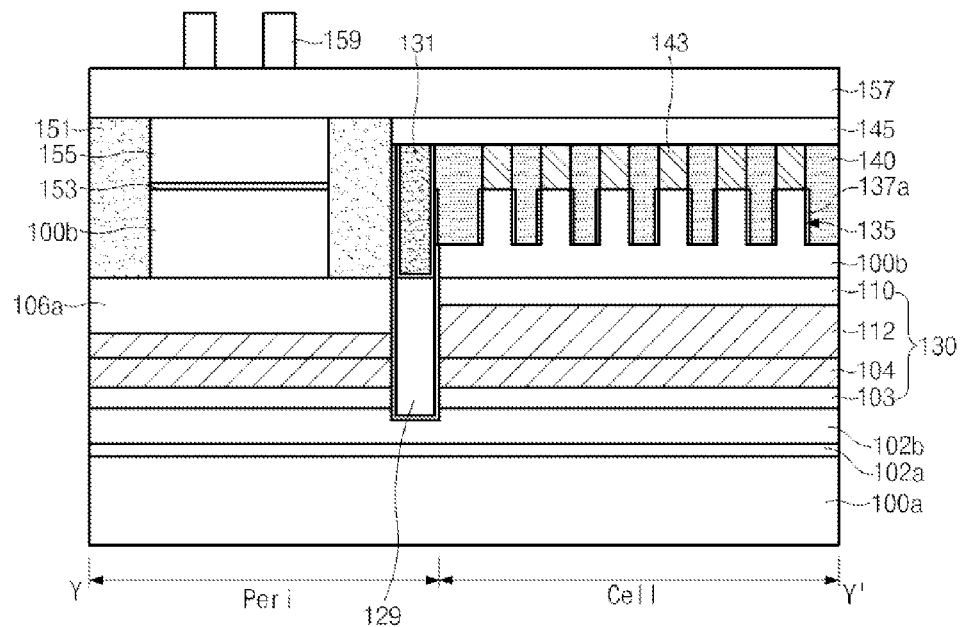
Figure 4V:
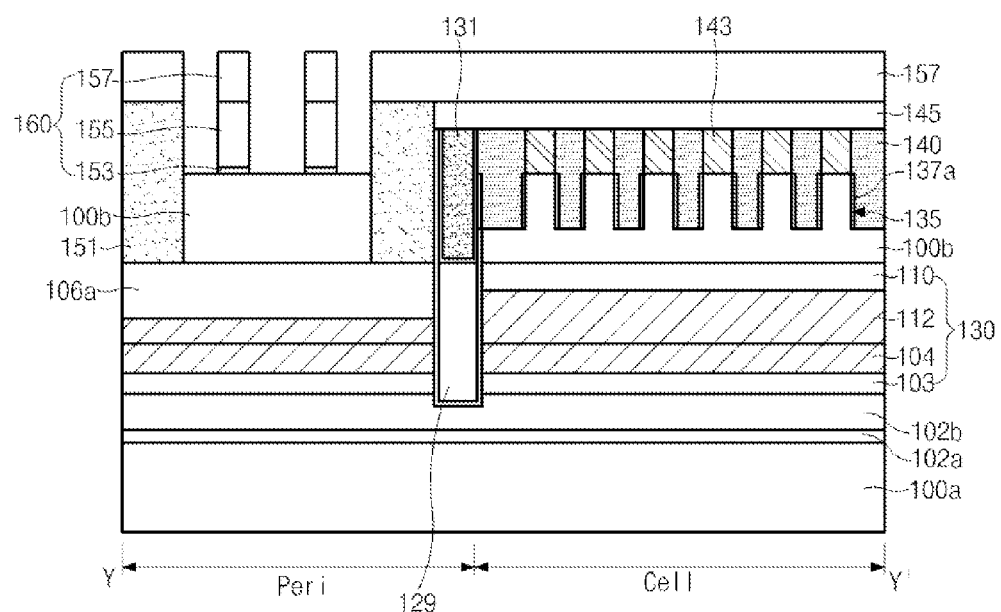
Figure 4W:
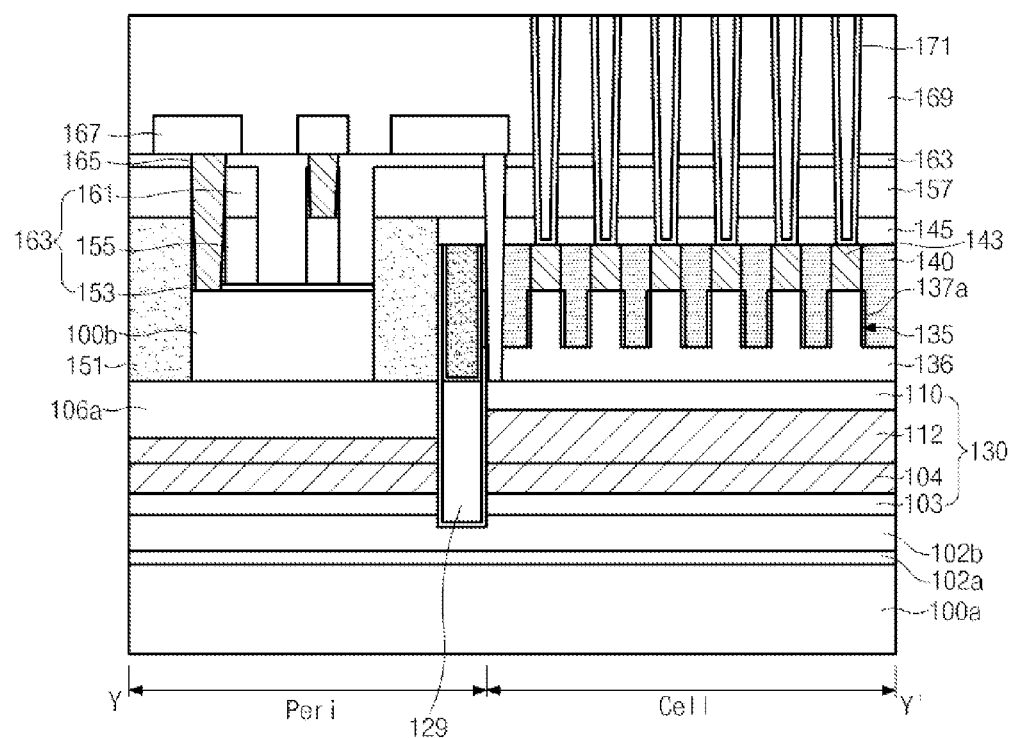

FIGS. 4A to 4W are plan views or cross-sectional views illustrating a method for forming the semiconductor device according to an embodiment. In more detail, FIG. 4B(ii) is a cross-sectional view illustrating the semiconductor device taken along the line X-X' of FIG. 4B(i). FIG. 4H(ii) is a cross-sectional view illustrating the semiconductor device taken along the line X-X' of FIG. 4H(i), FIG. 4I(ii) is a cross-sectional view illustrating the semiconductor device taken along the line X-X' of FIG. 4I(i), FIG. 4I(iii) is a cross-sectional view illustrating the semiconductor device taken along the line Y-Y' of FIG. 4I(i), and FIG. 4P(ii) is a cross-sectional view illustrating the semiconductor device taken along the line Y-Y' of FIG. 4P(i).

Referring to FIG. 4A, a buffer film 120 and a hard mask layer 122 are deposited over the second silicon substrate 100b of the wafer shown in FIG. 1. In accordance with the wafer shown in FIG. 1, the cell region may include a Silicon-Metal-Silicon (SMS) wafer including a stacked structure of silicon, metal, and silicon; and the peripheral region may include a Silicon On Insulator (SOI) wafer including a stacked structure of a silicon film and an insulation film. In addition, the buffer film 120 may include a silicon oxide film and be formed by applying an oxidation process to the second silicon substrate 100b. The hard mask layer 122 may be a Si₃N₄ film.

Referring to FIG. 4B(ii), a first mask pattern 124 defining a buried bit line region is formed over the second silicon substrate 100b. The first mask pattern 124 may be formed of a photoresist film, and may be formed not only over a buried bit line region of the cell region but also over the peripheral region. The first mask pattern 124 may be formed in a line shape as shown in FIG. 4B(i). Thereafter, the hard mask layer 122, the buffer film 120, the second silicon substrate 100b, the metal silicide layer 110, the second metal layer 112, the first metal layer 104, the titanium nitride (TiN) film 103, the second silicon insulation film 102b, the first silicon insulation film 102a, and the first silicon substrate 100a are partially etched using the first mask pattern 124 as an etch mask, resulting in formation of a line pattern 123.

Referring to FIG. 4C, the first mask pattern 124 is removed. A first liner insulation film 125 is deposited over the entire surface including the line pattern 123. The first liner insulation film 125 may include a nitride film, and may be deposited to protect the first metal layer 104 and the second metal layer 112 of the line pattern 123.

Referring to FIG. 4D, a first sacrificial film 126 is deposited over the entire upper surface over which the first liner insulation film 125 is formed. The first sacrificial film 126 may be formed using a Spin On Carbon (SOC) film having superior gapfill characteristics.

Referring to FIG. 4E, the first sacrificial film 126 is etched so that the second silicon substrate 100b of the line pattern 123 is protruded. Thereafter, a second liner insulation film 127 is deposited over the entire surface including the etched first sacrificial film 126 and the protruded line pattern 123. The second liner insulation film 127 may include an oxide film. More preferably, the second liner insulation film 127 may include a Ultra Low Temperature Oxide (ULTO) film. The second liner insulation film 127 may have a thickness of about 50~100 Å.

Referring to FIG. 4F, the first sacrificial film 126 remaining in a lower part is removed. The first sacrificial film 126 may be removed using O₂ plasma. When the first sacrificial film 126 is removed, the first liner insulation film 125 and the second liner insulation film 127 are not etched and remain intact. As a result, an air-gap 129 is formed at a lower portion of the second liner insulation film 127, and a buried bit line 130 including a stacked structure of the TiN film 103, the first metal layer 104, the second metal layer 112, and the metal silicide layer 110 is formed between the air-gaps 129. In this case, the TiN film 103 formed below the buried bit line 130 may serve as a glue layer. The metal silicide layer 110 formed over the buried bit line 130 is used as a barrier metal layer, such that interfacial resistance between the second silicon substrate 100b and the buried bit line 130 can be reduced. As described above, since the buried bit line 130 is formed using the metal layer of the wafer, an additional fabrication process for forming the buried bit line 130 need not be carried out. Accordingly, a fabrication process of forming the buried bit line 130 may be simplified, such that the semiconductor device can be easily fabricated.

Referring to FIG. 4G, a gapfill insulation film 131 is formed over the second liner insulation film 127 between the line patterns 123. The gapfill insulation film 131 may be formed of an oxide film having superior gapfill characteristics. Thereafter, a planarization (CMP) process is performed until the hard mask layer 122 formed over the line pattern 123 is exposed.

Referring to FIG. 4H, a second mask pattern 133 opening a vertical gate region is formed over the hard mask layer 122 of an upper end of the line pattern 123 and over the gapfill insulation film 131. The vertical gate region is extended across the buried bit line 130. For example, the vertical gate region may extend along the X-X' direction of FIG. 4h(i), and the buried bit line 130 may extend along perpendicular to the X-X' direction.

FIG. 4I(ii) shows a cross-sectional view illustrating the semiconductor device taken along the line X-X' (perpendicular to the direction in which the buried bit line 130 extends) of FIG. 4I(i), and FIG. 4I(iii) shows a cross-sectional view illustrating the semiconductor device taken along the line Y-Y' of FIG. 4I(i) in which the buried bit line 130 extends. Referring to FIG. 4I(ii) and (iii), a lower gapfill insulation film 131 and an upper line pattern 123 are etched using the second mask pattern 133 as an etch mask, resulting in formation of a plurality of pillar patterns 135. The second mask pattern 133 in the cell region extends across the buried bit line 130, such that an upper part of the line pattern 123 is etched to form the pillar patterns 135.

Referring to FIG. 4J, a gate insulation film (not shown) is formed over the entire surface including the pillar pattern 135. The gate insulation film (not shown) may include an oxide film and be formed through an oxidation process. Thereafter, a gate conductive film 137 is formed over the entire surface including the etched gapfill insulation film 131 and the pillar pattern 135 including a gate insulation film (not shown). Here, the gate conductive film 137 may include a titanium (Ti) film, a titanium nitride (TiN) film, or a combination thereof. At this time, a thickness of the gate conductive film 137 may be a critical dimension (CD) of a gate to be formed in a subsequent process.

Referring to FIG. 4K, the gate conductive film 137 formed over the hard mask layer 122 and over the second silicon substrate 100b between the pillar patterns 135 is etched, such that a gate 137a is formed at a sidewall of the pillar pattern 135. In this case, the process for etching the gate conductive film 137 may be an anisotropic etching process, and may be continued until the buffer film 120 and the hard mask layer 122 of an upper part of the pillar pattern 135 are exposed.

Referring to FIG. 4L, a second sacrificial film 140 is formed over the entire upper portion including the pillar pattern 135 and the gate 137a. A planarization (CMP) process is carried out so that the hard mask layer 122 formed over the pillar pattern 135 is exposed.

Referring to FIG. 4M, the exposed hard mask layer 122 and the exposed buffer layer 120 of the cell region are removed so that an upper portion of the pillar pattern 135 is exposed. The area where the hard mask layer 122 and the buffer layer 120 are removed may be used as a storage node contact (SNC) region.

Referring to FIG. 4N, a polysilicon layer is buried in the SNC region from which the hard mask layer 122 and the buffer layer 120 are removed, resulting in formation of a storage node contact (SNC) plug 143.

Referring to FIG. 4O, a capping film 145 is formed over the entire surface including the SNC plug 143 and the second sacrificial film 140. The capping film 145 may include a material including a nitride film.

Referring to FIG. 4P, a third mask pattern 147 is formed over the capping film 145 in an active region and the peripheral region. The third mask pattern 147 may be formed to open the device isolation film in the peripheral region. The active region of the peripheral region may be in a bar shape, and the bar-shaped active regions may be spaced apart from each other by a predetermined distance.

Referring to FIG. 4Q, the capping film 145, the hard mask layer 122, the buffer film 120, and the second silicon substrate 100b of the peripheral region are etched using the third mask pattern 147 as an etch mask, resulting in formation of a trench 149 defining a device isolation region. The device isolation trench 149 may be etched until the silicon oxide film pattern 106a located below the second silicon substrate 100b is exposed. When the device isolation trench 149 is formed, an alignment key 107 formed in the peripheral region may be removed. The alignment key 107 may be located anywhere in the peripheral region. Thus, when the alignment key 107 is located outside of the device isolation region, the alignment key 107 may remain intact even after the device isolation trench 149 is formed. Thereafter, the third mask pattern 147 is removed.

Referring to FIG. 4R, after an oxide film for device isolation is formed over the entire surface including the device isolation trench 149, a planarization (CMP) process is performed until the capping film 145 is exposed, such that a device isolation film 151 is formed in the peripheral region.

Referring to FIG. 4S, a mask pattern (not shown) opening the peripheral region is formed. The capping film 145, the hard mask layer 122, and the buffer film 120 in the peripheral region are removed. Since the capping film 145, the hard mask layer 122, and the buffer film 120 are removed, the second silicon substrate 100b defining the active region is exposed. The oxidation process is applied to a surface of the exposed second silicon substrate 100b formed by removal of the capping film 145, the hard mask layer 122, and the buffer film 120, such that a gate oxide film 153 is formed. A gate conductive material 155 is formed over the entire surface including the gate oxide film 153. In this case, the gate conductive material 155 may be formed of a polysilicon material.

Referring to FIG. 4T, a planarization (CMP) process is performed until the capping film 145 of the cell region is exposed. That is, the gate conductive material 155 formed in the cell region is removed.

Referring to FIG. 4U, a gate hard mask layer 157 is formed over the entire surface of the cell region and the peripheral region. The gate hard mask layer 157 may be formed of an oxide film. Subsequently, a gate mask pattern 159 defining a gate region is formed over the gate hard mask layer 157 of the peripheral region.

Referring to FIG. 4V, the gate hard mask layer 157, the gate conductive material 155, and the gate oxide film 153 are sequentially etched using the gate mask pattern as an etch mask, such that a gate pattern 160 is formed in the peripheral region.

Referring to FIG. 4W, a first interlayer insulation film 163 is formed over the entire surface including the peripheral region in which the gate pattern 160 is formed. In addition, the first interlayer insulation film 163 and the gate hard mask layer 157 of the peripheral region are etched such that a first contact hole configured to expose the active region of the second silicon substrate 100b. By the first contact hole, the gate conductive material 155 is removed from one or more of gate patterns 160. In the cell region located adjacent to the peripheral region, a first interlayer insulation film 163, a gate hard mask layer 157, a capping film 145, and a gapfill oxide film 140 are etched, such that a second contact hole (not shown) exposing a buried bit line 130 is formed.

After that, a conductive material is buried in the first contact holes to form a contact plug 165. Then, a metal material is deposited over the first interlayer insulation film 163 including the contact plug 165. In addition, the metal material is patterned so that a metal line 167 coupled to each contact plug 165 is formed. A second interlayer insulation film 169 is formed over the first interlayer insulation film 163 including the metal line 167. The second interlayer insulation film 169, the first interlayer insulation film 163, the gate hard mask layer 157, and the capping film 145 of the cell region are etched, such that a storage node region exposing the storage node contact (SNC) plug 143 is formed. Thereafter, a conductive material is deposited in the storage node region, such that a storage node 171 coupled to the SNC plug 143 is formed.

As described above, the SMS-structured wafer is used for the cell region, such that a metal layer of the wafer can be used as a buried bit line without the necessity of forming an additional buried bit line. In addition, the SOI-structured wafer is used for the peripheral region, such that the semiconductor device including the SOI-structured wafer may have a higher speed due to reduced junction capacitance. In addition, when the SOI-structured wafer is used for the peripheral region, a threshold voltage may be reduced and thus the device may properly operate under a lower input voltage condition. Furthermore, under SOI-structure, device isolation can be made more securely, latch-up characteristics of the device improves, compared to semiconductor devices employing a bulk-silicon substrate.

As is apparent from the above description, the semiconductor device and the method for forming the same according to the embodiments can reduce a fabrication difficulty in forming a buried bit line at a lower portion of a word line of a cell region. As a result, productivity as well as performance of the peripheral region improves.

The above embodiments are illustrative and not limitative. Various alternatives and equivalents are possible. Embodiments are not limited by the type of deposition, etching polishing, and patterning steps described herein. Nor are embodiments limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:
1. A semiconductor device comprising:
 a semiconductor substrate including a cell region and a peripheral region;
 a Silicon-Metal-Silicon (SMS)-structured wafer provided in the cell region and including a stacked structure of a first silicon substrate, a metal layer, a metal silicide layer, and a second silicon substrate; and
 a Silicon On Insulator (SOI)-structured wafer provided in the peripheral region and including a stacked structure of the first silicon substrate, a first silicon insulation film on an upper surface of the first silicon substrate, the metal layer, the second silicon substrate, and a second silicon insulation film on a lower surface of the second silicon substrate,
 wherein the metal layer extends across the SOI-structured wafer and the SMS-structured wafer,
 wherein the second silicon insulation film is disposed between the metal layer and the second silicon substrate,
 wherein the metal silicide layer is disposed over the metal layer that extends across the SMS-structured wafer; and
 wherein the second silicon insulation film of the SOI-structured wafer is coplanar with the metal silicide layer of the SMS-structured wafer.
2. The semiconductor device according to claim 1, wherein the metal silicide layer is formed over the metal layer.
3. The semiconductor device according to claim 1, wherein the metal layer includes a tungsten (W) material.

4. The semiconductor device according to claim 1, further comprising:
a silicon oxide film and a glue layer formed over the first silicon substrate in the cell region and in the peripheral region.

5. The semiconductor device according to claim 2, wherein a distance between an upper surface of the first silicon substrate and an upper surface of the second insulation film is the same as a distance between the upper surface of the first silicon substrate and an upper surface of the metal silicide layer.

6. The semiconductor device according to claim 1, further comprising:
an alignment key formed in the second silicon substrate of the peripheral region.

7. A semiconductor device comprising:
a Silicon-Metal-Silicon (SMS)-structured cell region including a stacked structure of a first silicon substrate, a metal layer, a metal silicide layer, and a second silicon substrate;
a Silicon On Insulator (SOI)-structured peripheral region including a stacked structure of the first silicon substrate, a first silicon insulation film on an upper surface of the first silicon substrate, the metal layer, the second silicon substrate, and a second silicon insulation film on a lower surface of the second silicon substrate;
a line-shaped buried bit line formed over the first silicon substrate of the cell region and including the metal layer;
a plurality of pillar patterns formed over the buried bit line; and
a gate formed at a sidewall of each pillar pattern so as to interconnect the plurality of pillar patterns,
wherein the metal layer extends across the SMS-structured cell region and the SOI-structured peripheral region,
wherein the second silicon insulation film is disposed between the metal layer and the second silicon substrate,
wherein the metal silicide layer is disposed over the metal layer that extends across the SMS-structured cell region, and
wherein the second silicon insulation film of the SOI-structured wafer peripheral region is coplanar with the metal silicide layer of the SMS-structured cell region.

8. The semiconductor device according to claim 7, wherein the metal layer includes tungsten (W).

9. The semiconductor device according to claim 7, further comprising:
a glue layer formed below the metal layer,
wherein the metal silicide layer is formed over the metal layer.

10. The semiconductor device according to claim 9, wherein the glue layer includes a titanium nitride (TiN) film, and the metal silicide layer includes a cobalt silicide material.

11. The semiconductor device according to claim 7, wherein the gate is formed in a line shape extending along a direction perpendicular to the buried bit line.

12. The semiconductor device according to claim 7, further comprising:
an alignment key formed in the second silicon substrate in the peripheral region.

13. The semiconductor device according to claim 7, further comprising:
a peri-gate structure formed over the second silicon substrate in the peripheral region.

14. The semiconductor device of claim 9, wherein an upper surface of the metal silicide layer is coplanar with an upper surface of the second silicon insulation film.

15. A semiconductor device comprising:
a Silicon-Metal-Silicon (SMS) cell region including a stacked structure of:
a first silicon substrate;
a first insulation layer disposed over the first silicon substrate;
a metal layer disposed over the first insulation layer;
a metal silicide layer disposed over the metal layer; and
a second silicon substrate disposed over the metal layer, and
a Silicon On Insulator (SOI) peripheral region including a stacked structure of:
the first silicon substrate;
the metal layer disposed over the first insulation layer;
a second insulation layer disposed over the metal layer; and
the second silicon substrate disposed over second insulation layer,
wherein the metal layer extends across the SMS cell region and the SOI peripheral region,
wherein the metal silicide layer is disposed over the metal layer that extends across the SMS cell region,
wherein the second insulation layer of the SOI peripheral region is coplanar with the metal silicide layer SMS cell region.

16. The semiconductor device of claim 15, wherein a thickness of the second insulation layer and the metal layer in the SOI peripheral region is the same as a thickness of the metal layer and the metal silicide layer in the SMS region.

17. The semiconductor device of claim 15, wherein an upper surface of the metal silicide layer is coplanar with an upper surface of the second insulation layer.

18. The semiconductor device of claim 15, wherein an alignment key protrudes from the second insulation layer through the second silicon substrate.

19. The semiconductor device of claim 18, wherein the alignment key and the second insulation layer are a same material.

20. The semiconductor device of claim 15, further comprising a glue layer disposed between the first insulation layer and the metal layer.

* * * * *